United States Patent
Iloreta et al.

(10) Patent No.: US 9,127,927 B2
(45) Date of Patent: Sep. 8, 2015

(54) TECHNIQUES FOR OPTIMIZED SCATTEROMETRY

(71) Applicants: Jonathan Iloreta, Menlo Park, CA (US); Paul Aoyagi, Sunnyvale, CA (US); Hanyou Chu, Palo Alto, CA (US); Jeffrey Chard, San Mateo, CA (US); Peilin Jiang, Santa Clara, CA (US); Mikhail Sushchik, Pleasanton, CA (US); Leonid Poslavsky, Belmont, CA (US); Philip D. Flanner, III, Union City, CA (US)

(72) Inventors: Jonathan Iloreta, Menlo Park, CA (US); Paul Aoyagi, Sunnyvale, CA (US); Hanyou Chu, Palo Alto, CA (US); Jeffrey Chard, San Mateo, CA (US); Peilin Jiang, Santa Clara, CA (US); Mikhail Sushchik, Pleasanton, CA (US); Leonid Poslavsky, Belmont, CA (US); Philip D. Flanner, III, Union City, CA (US)

(73) Assignee: KLA-Tencor Corporation, Milpitas, CA (US)

(*) Notice: Subject to any disclaimer, the term of this patent is extended or adjusted under 35 U.S.C. 154(b) by 366 days.

(21) Appl. No.: 13/712,734

(22) Filed: Dec. 12, 2012

(65) Prior Publication Data
US 2013/0158948 A1 Jun. 20, 2013

Related U.S. Application Data

(60) Provisional application No. 61/576,825, filed on Dec. 16, 2011.

(51) Int. Cl.
*G06F 17/16* (2006.01)
*G01B 11/30* (2006.01)
*G06F 7/00* (2006.01)
*G06F 17/40* (2006.01)
*G06F 19/00* (2011.01)
*G01B 11/00* (2006.01)
*H01L 21/66* (2006.01)
*G01B 11/24* (2006.01)
*G03F 7/20* (2006.01)

(52) U.S. Cl.
CPC .............. *G01B 11/00* (2013.01); *G01B 11/24* (2013.01); *G01B 11/30* (2013.01); CPC .......... *G03F 7/70625* (2013.01); *G06F 7/00* (2013.01); *G06F 17/16* (2013.01); *H01L 22/12* (2013.01); *G01B 2210/56* (2013.01); *G06F 17/40* (2013.01); *G06F 19/00* (2013.01)

(58) Field of Classification Search
CPC ............ G01B 7/00; G01B 7/34; G01B 11/00; G01B 11/14; G01B 11/24; G01B 11/30; G01B 11/303; G01B 15/00; G01B 15/08; G01B 21/00; G01B 21/30; G01B 2210/00; G01B 2210/56; G01D 7/00; G01D 9/00; G01D 21/00; G01N 21/00; G01N 21/17; G01N 21/21; G01N 21/47; G01N 23/00; G01N 23/22; G01N 2223/00; G01N 2223/07; G03B 27/00; G03B 27/32; G03F 7/00; G03F 7/20; G03F 7/70483; G03F 7/70608; G03F 7/70616; G03F 7/7062; G06F 7/00; G06F 7/60; G06F 11/00; G06F 11/30; G06F 11/32; G06F 11/34; G06F 15/00; G06F 15/16; G06F 17/00; G06F 17/10; G06F 17/16; G06F 17/40; G06F 19/00; G06T 7/00; H01L 21/00; H01L 21/67; H01L 21/67005; H01L 21/67242; H01L 21/67288; H01L 22/00; H01L 22/10; H01L 22/12
USPC ........ 73/432.1, 865.8, 865.9, 866.3; 250/200, 250/215, 306, 307, 336.1, 358.1, 559.01, 250/559.19, 559.22, 559.4; 356/237.1, 356/237.2, 237.3, 337, 338, 342, 365, 369, 356/601, 612, 613, 625, 626, 635, 638; 378/1, 70, 71, 82, 86; 382/100, 141, 382/145; 438/5, 7, 14, 16; 702/1, 81, 82, 702/83, 84, 127, 155, 156, 157, 158, 166, 702/167, 182, 187, 189; 708/100, 105, 200
See application file for complete search history.

(56) References Cited

U.S. PATENT DOCUMENTS

| | | | |
|---|---|---|---|
| 7,106,459 | B2 | 9/2006 | Chu |
| 7,190,453 | B1 | 3/2007 | Aoyagi et al. |
| 7,362,686 | B1 | 4/2008 | Aoyagi et al. |
| 7,391,524 | B1 | 6/2008 | Chen et al. |
| 7,525,672 | B1 | 4/2009 | Chen et al. |
| 7,756,677 | B1 | 7/2010 | Li |
| 8,108,328 | B2 | 1/2012 | Hench |
| 8,560,270 | B2 * | 10/2013 | Chu .............................. 702/182 |
| 8,798,966 | B1 | 8/2014 | Hench et al. |
| 2007/0153275 | A1 | 7/2007 | Aa et al. |
| 2008/0071504 | A1 | 3/2008 | Li et al. |
| 2010/0017351 | A1 | 1/2010 | Hench |
| 2010/0141925 | A1 | 6/2010 | Cao et al. |
| 2010/0145655 | A1 * | 6/2010 | Chu .............................. 702/182 |

FOREIGN PATENT DOCUMENTS

| | | |
|---|---|---|
| EP | 2239632 | 10/2010 |
| KR | 1020070072407 | 7/2007 |
| KR | 1020080111493 | 12/2008 |
| KR | 1020100013284 | 2/2010 |

OTHER PUBLICATIONS

International Preliminary Report on Patentability and Written Opinion from PCT/US2012/069910 mailed Jun. 26, 2014, 8 pages.

International Search Report and Written Opinion from PCT/US2012/069910 mailed Apr. 26. 2013, 10 pages.

Germer et al. "Polarization of light scattered by microrough surfaces and subsurface defects." *Journal of the Optical Society of America*, Jun. 1999.

Chu, Hanyou, "Finite Difference Approach to Optical Scattering of Gratings," *Advanced Characterization Techniques for Optics, Semiconductors, and Nanotechnologies, Proceedings of the SPIE*, vol. 5188, Nov. 2003, pp. 358-370.

Jiang, P. L., et al., "Forward solve algorithms for optical critical dimension metrology," *Metrology, Inspection, and Process Control for Microlithography XXII, Proceedings of the SPIE*, vol. 6922, Apr. 2008, pp. 69221O-69221O-7.

Shen, Jie, "Efficient Spectral-Galerkin Method I. Direct Solvers for the Second and Fourth Order Equations Using Legendre Polynomials," *Society for Industrial and Applied Mathematics, SIAM J. Sci. Comput.* vol. 15, No. 6, Nov. 1994, pp. 1489-1505.

Moler, Cleve et al., "Nineteen dubious ways to comput the Exponential of a Matrix twenty-five years later," *SIAM Review*, vol. 45, No. 1 (2003) pp. 1-46.

Zhou, Chuanhong et al., "Formulation of Fourier modal method for symmetric crossed gratings in symmetric mountings," *J. Opt. A: Pure Appl. Opt* 6 (2004), pp. 43-50.

Li, Lifeng, "New formulation of the Fourier modal method for crossed surface-relief gratings", *Optical Sciences Center, University of Arizona, J. Opt. Soc. Am. A*/vol. 14, No. 10/Oct. 1997.

Lee, Lie-Quan et al., *"Library Generation With Derivatives in Optical Metrology"*, U.S. Appl. No. 13/610,613, filed Sep. 11, 2012, 60 pages.

International Search Report and Written Opinion from PCT/US2012/068786 mailed Apr. 1, 2013, 12 pgs.

International Preliminary Report on Patentability from PCT/US2012/068786 mailed Jun. 26, 2014, 9 pgs.

Office Action dated Jan. 30, 2015 (+ English translation), in Korean Patent Application No. 10-2014-7019875, 6 pages.

Office Action mailed Feb. 12, 2015, in U.S. Appl. No. 13/610,613, 14 pages.

\* cited by examiner

*Primary Examiner* — Edward Cosimano
(74) *Attorney, Agent, or Firm* — Blakely Sokoloff Taylor Zafman LLP

(57) ABSTRACT

Provided are optimized scatterometry techniques for evaluating a diffracting structure. In one embodiment, a method includes computing a finite-difference derivative of a field matrix with respect to first parameters (including a geometric parameter of the diffracting structure), computing an analytic derivative of the Jones matrix with respect to the field matrix, computing a derivative of the Jones matrix with respect to the first parameters, and computing a finite-difference derivative of the Jones matrix with respect to second parameters (including a non-geometric parameter). In one embodiment, a method includes generating a transfer matrix having Taylor Series approximations for elements, and decomposing the field matrix into two or more smaller matrices based on symmetry between the incident light and the diffracting structure.

40 Claims, 7 Drawing Sheets

TECHNIQUES FOR OPTIMIZED SCATTEROMETRY

PRIORITY

This application is a Non-Provisional of, claims priority to, and incorporates by reference in its entirety for all purposes, expired U.S. Provisional Patent Application No. 61/576,825 filed Dec. 16, 2011.

TECHNICAL FIELD

Embodiments of the invention pertain to scatterometry and more particularly to evaluation of a diffracting structure.

BACKGROUND

Optical metrology techniques generally referred to as scatterometry offer the potential to characterize parameters of a workpiece (i.e., a sample) during a manufacturing process. In practice, light is directed onto a periodic grating formed in a workpiece and spectra of reflected light are measured and analyzed to characterize the grating. Characterization parameters may include critical dimensions (CDs), sidewall angles (SWAs) and heights (HTs) of gratings, material dispersion parameters, etc., which affect the polarization and intensity of the light reflected from or transmitted through a material. Characterization of the grating may thereby characterize the workpiece as well as manufacturing process employed in the formation of the grating and the workpiece. For example, the optical metrology system 100 depicted in FIG. 1 can be used to determine the profile of a grating 102 formed on a semiconductor wafer 104. The grating 102 can be formed in test areas on the wafer 104, such as adjacent to a device formed on the wafer 104. The optical metrology system 100 can include a photometric device with a source 106 and a detector 112. The grating 102 is illuminated by an incident beam 108 from source 106. In the present exemplary embodiment, the incident beam 108 is directed onto the grating 102 at an angle of incidence $\theta_i$ with respect to normal of the grating 102 and an azimuth angle $\phi$ (e.g., the angle between the plane of incidence beam 108 and the direction of the periodicity of the grating 102). A diffracted beam 110 leaves at an angle of $\theta_d$ with respect to normal and is received by the detector 112. The detector 112 converts the diffracted beam 110 into a measured metrology signal. To determine the profile of the grating 102, the optical metrology system 100 includes a processing module 114 configured to receive the measured metrology signal and analyze the measured metrology signal.

Analysis of measured spectra generally involves comparing the measured sample spectra to simulated spectra 116 to deduce a scatterometry model's parameter values that best describe the measured sample. As used herein, "model" refers to a scatterometry model and "parameter" refers to a model parameter of the scatterometry model unless otherwise specified.

FIG. 2 illustrates a method 200 for analyzing a diffracting structure in accordance with one embodiment of the invention. At block 202, an optical metrology system (e.g., the optical metrology system 100 of FIG. 1) performs measurements of a sample with a diffracting structure. Performing measurements involves shining light on the sample and measuring spectral information for the sample such as reflectance. At block 204, the optical metrology system identifies an initial model of the measurement process. Identifying the initial model of the measurement process includes constructing a geometric model of the diffracting structure, determining how to parameterize the geometric model, characterizing the incident light, and characterizing the optical measurement system. Typically, model parameters include layer thicknesses, material dispersion parameters, SWAs and HTs, angle of incidence of light directed onto the diffracting structure, calibration parameters of an optical measurement system, etc. Based on the model parameters, the optical metrology system determines reflectance from the diffracting structure (e.g., via a simulation). Reflectance is generally determined using rigorous diffraction modeling algorithms, such as the Rigorous Coupled Wave Analysis (RCWA) method based on Maxwell's equations.

At block 206, the optical metrology system attempts to fit the modeled data obtained at block 204 to the experimental data obtained at block 202. Fitting the modeled data generally involves comparing the modeled data to the experimental data and determining an error between the two sets of data. The initial model identified is generally based on expected parameters of the diffracting structure, and typically results in an error significant enough to require additional iterations of blocks 204 and 206. Therefore, the optical metrology system performs a regression analysis. In the regression analysis, the optical metrology system determines the next set of model parameters to use, 208. The next set of model parameters is generally based on the derivative of the error. The optical metrology system repeats blocks 204 and 206 until one or more conditions occur indicating the regression should be terminated. Conditions can include reaching (or sufficiently approaching) convergence such that the error is below a threshold value. Other conditions that can terminate the regression include: reaching a maximum number of iterations, determining that the difference between previous model parameters and current model parameters is less than a threshold value, and/or any other conditions justifying discontinuing further iterations of block 204 and 206.

Once a condition is reached for terminating the regression, the optical metrology system can determine values of parameters of the actual diffracting structure based on the best fit model parameters, at block 210. Upon completing the regression, the scatterometry model is typically close enough to the actual diffracting structure that determining values of some parameters of the actual diffracting structure may simply involve ascertaining the best fit model parameters. This can be true, for example, for geometric parameters that have a one-to-one correspondence with a single parameter used in the scatterometry model. Determining other parameters of the actual diffracting structure may involve additional operations such as adding two parameters of the scatterometry model together.

The method 200 involves computations which can be time intensive and resource intensive (e.g., requiring large amounts of computer memory and/or processing power). For example, computing spectral information for a model at block 204 and determining next parameters at 208 generally involve complex derivatives. Furthermore, scatterometry computations have become increasingly complex due to, for example, increasing complexity of the geometry of the diffracting structures being evaluated. Complex geometry can make computations such as the derivatives used at blocks 204 and 208 infeasible or impractical. Computations which are time and resource intensive can inhibit the method 200 from providing measurements in a sufficiently timely manner for use in some applications such as semiconductor manufacturing.

BRIEF DESCRIPTION OF THE DRAWINGS

Embodiments of the present invention are illustrated by way of example, and not by way of limitation, in the figures of the accompanying drawings, in which.

DETAILED DESCRIPTION

Figure 1:
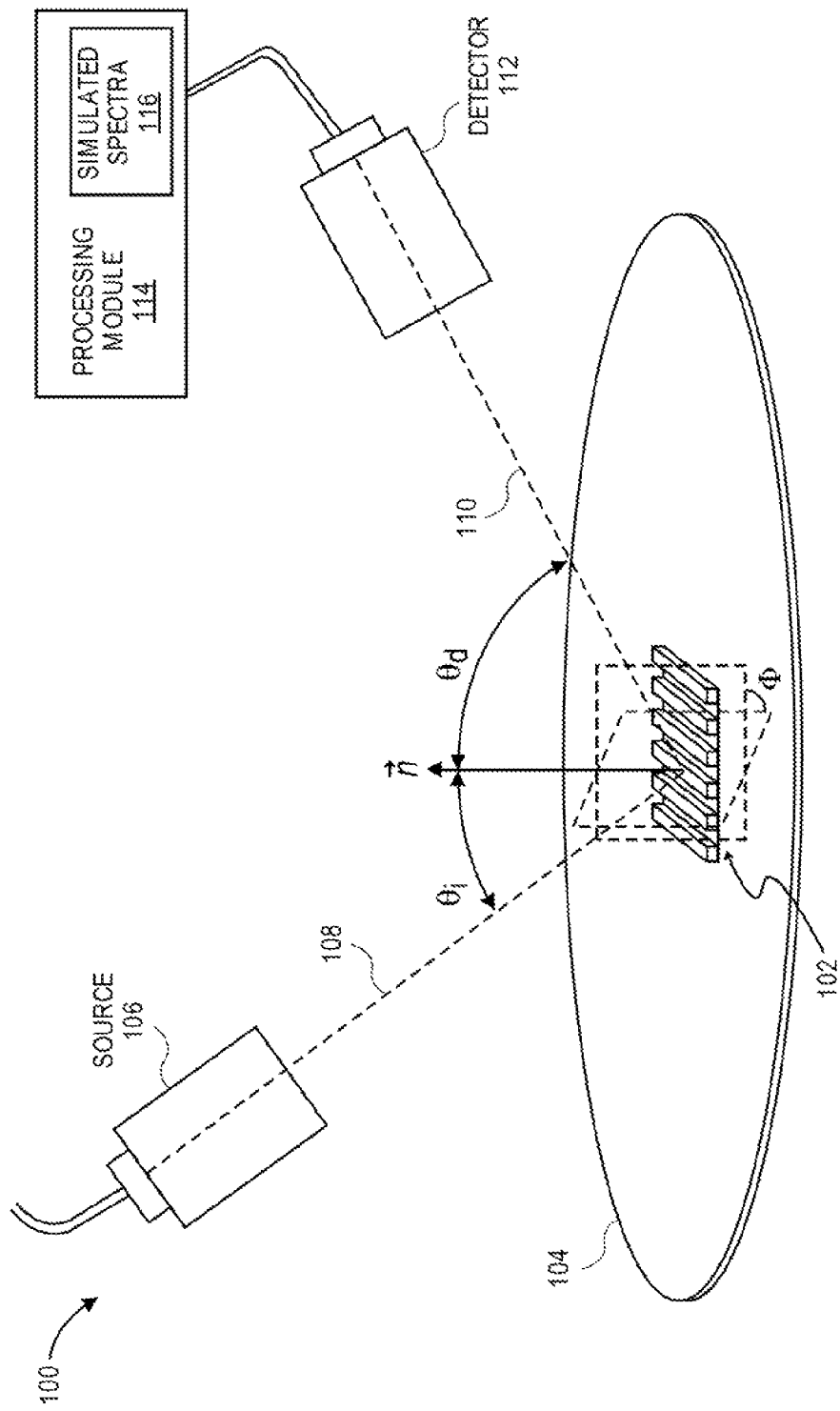
FIG. 1 depicts an exemplary optical metrology system for scatterometry.

Embodiments of the invention include methods, apparatuses, and systems for optimizing scatterometry techniques. Scatterometry computations can involve calculating parameters and/or other values during model analysis, model library generation, regression analysis, and/or system calibration. For example, a scatterometry system can analyze a model of a diffracting structure to determine the parameterization that gives the lowest correlation between parameters, and use a regression analysis to compute the best fit values of these parameters. Parameters for the model can then be used to determine the parameters of the actual diffracting structure, and therefore enable evaluation of other structures on the sample (e.g., device structures on the wafer). Parameters can include geometric parameters (e.g., CDs, HTs, SWAB, film thicknesses, unit cell orthogonality angle, and other geometric parameters), material parameters (e.g., dielectric constants, and other material parameters), other non-geometric parameters (e.g., the order of the Fourier transform used in the electromagnetic solver and other non-geometric parameters), system parameters (e.g., parameters for calibrating the measurement system such as wavelength of incident light, azimuth angle, angle of incidence, CCD-related parameters, parameters for a polarizer such as polarizer angle or analyzer angle, and other system parameters), and/or any other parameters in a scatterometry system.

In one embodiment, scatterometry techniques involve models based on approximate spectral methods and symmetry-accelerated spectral methods. In one such embodiment, approximate spectral methods include approximations to RCWA performed to evaluate a diffracting structure. The RCWA approximations can include spectral methods that approximate and/or replace eigensolver-based matrix exponential computations (and/or their trigonometric variants such as matrix sine, cosine, tangent, cosecant, secant, and cosecant computations) with non-eigensolver based approximations.

Symmetry-accelerated spectral methods involve using geometric symmetry with derivatives to accelerate measurements. Geometric symmetry includes symmetry in the diffracting structure to be evaluated with respect to the incident light, as is explained in further detail below. Optical metrology systems can use techniques involving symmetry-accelerated spectral methods to evaluate a variety of diffracting structures, for example, gratings which are periodic in one or two dimensions. Scatterometry using approximate spectral methods and symmetry-accelerated methods can improve the speed of diffracting structure evaluation and analysis by eliminating time-consuming eigenvalue computations, as well as reducing the derivative computation operation count.

According to one embodiment, a scatterometry technique includes hybrid derivatives for computing the derivative of a Jones matrix (e.g., a matrix containing spectral information for the diffracting structure). For example, a scatterometry system can compute a finite-difference derivative of a field matrix with respect to first parameters, where the field matrix includes material boundary information and the first parameters include a parameter describing the material boundaries of the diffracting structure. The optical metrology system further computes an analytic derivative of a Jones matrix with respect to the first parameters, using the finite-difference derivative of the field matrix with respect to the first parameters. In this exemplary embodiment, the optical metrology system further computes a finite-difference derivative of the Jones matrix with respect to second parameters including a non-material boundary parameter. The optical metrology system can then generate a single Jacobian matrix including the derivative of the Jones matrix with respect to both the first and second parameters. A scatterometry method using hybrid derivatives can improve the speed of diffracting structure evaluation and analysis.

Thus, embodiments include methods, computer-readable media embodying such methods, apparatuses, and systems for optimizing scatterometry techniques. Optimizations can result in reducing the number of computations, reducing the time required for computations (e.g., by reducing the complexity of computations and/or replacing complex computations with simpler computations), and/or reducing hardware requirements for computations (e.g., reducing the memory usage for computations).

In the following description, numerous details are set forth. It will be apparent, however, to one skilled in the art, that the present invention may be practiced without these specific details. For example, while the present methods are described in the context of scatterometry for diffraction grating parameter measurements, it should be appreciated that the methods may be readily adaptable to other contexts and applications by one of ordinary skill in the art.

In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

Some portions of the detailed descriptions provide herein are presented in terms of algorithms and symbolic representations of operations on data bits within a computer memory.

Unless specifically stated otherwise, as apparent from the following discussion, it is appreciated that throughout the description, discussions utilizing terms such as "calculating," "computing," "determining" "estimating" "storing" "collecting" "displaying," "receiving," "consolidating," "generating," "updating," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Figure 3A:
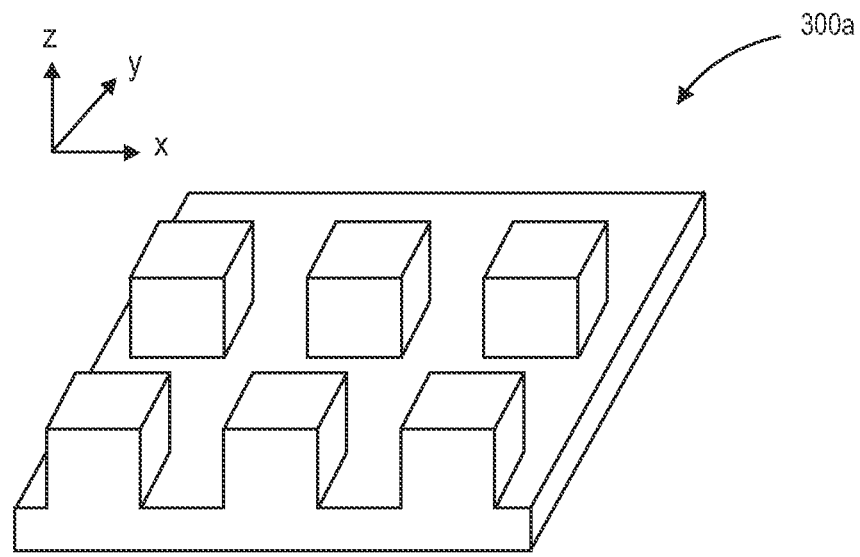
FIG. 3A illustrates a periodic grating having a profile that varies in the x-y plane, in accordance with an embodiment of the invention.
Figure 3B:
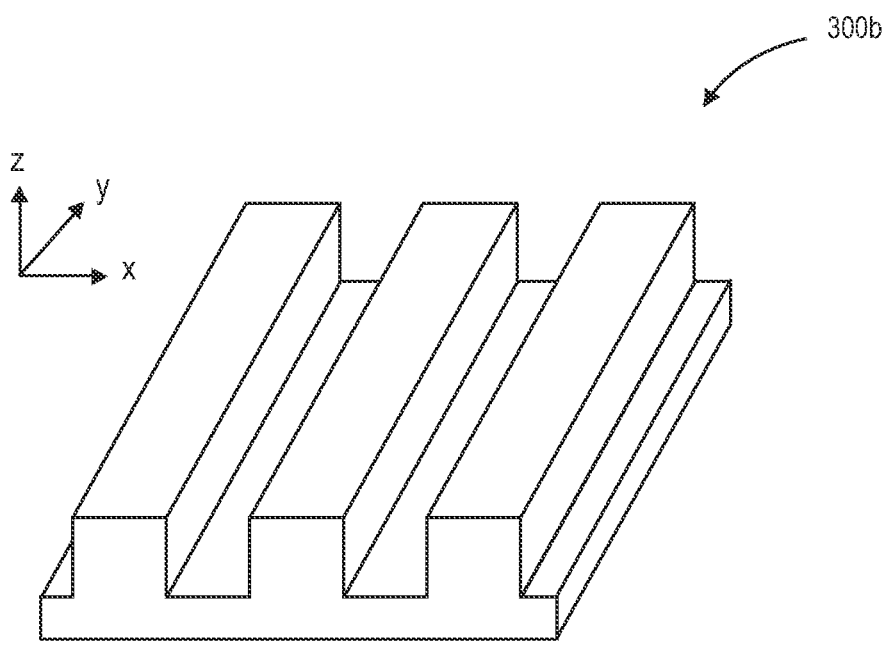
FIG. 3B illustrates a periodic grating having a profile that varies in the x-direction but not in the y-direction, in accordance with an embodiment of the invention.

FIGS. 3A and 3B are examples of diffracting structures which can be evaluated according to embodiments described herein. FIG. 3A illustrates an "island grating" 300a, which is periodic in two dimensions. The periodic grating 300a has a profile that varies in the x-y plane. The periodic grating 300a is also symmetric in two dimensions (here, in the x- and y-dimensions). A grating is symmetric in a dimension if the grating is the same on either side of a symmetry plane. For example, a grating is symmetric in the x-dimension if the grating is the same on either side of a plane defined by x=constant.

FIG. 3B illustrates a periodic grating having a profile that varies in the x-direction but not in the y-direction. Thus, periodic grating 300b is periodic in one dimension. It is to be understood that the lack of variation in the y-direction for a two-dimensional structure need not be infinite, but any breaks in the pattern are considered long range, e.g., any breaks in the pattern in the y-direction are spaced substantially further apart than the breaks in the pattern in the x-direction.

The description herein may refer to "layers." Layers can include dividing a diffracting structure (e.g., the periodic gratings 300a and 300b) into multiple slabs. The diffracting structure can be divided into multiple slabs of constant cross section, or into multiple slabs having different cross sections. Alternatively, in some embodiments, an optical metrology system can evaluate a single layer.

Figure 4:
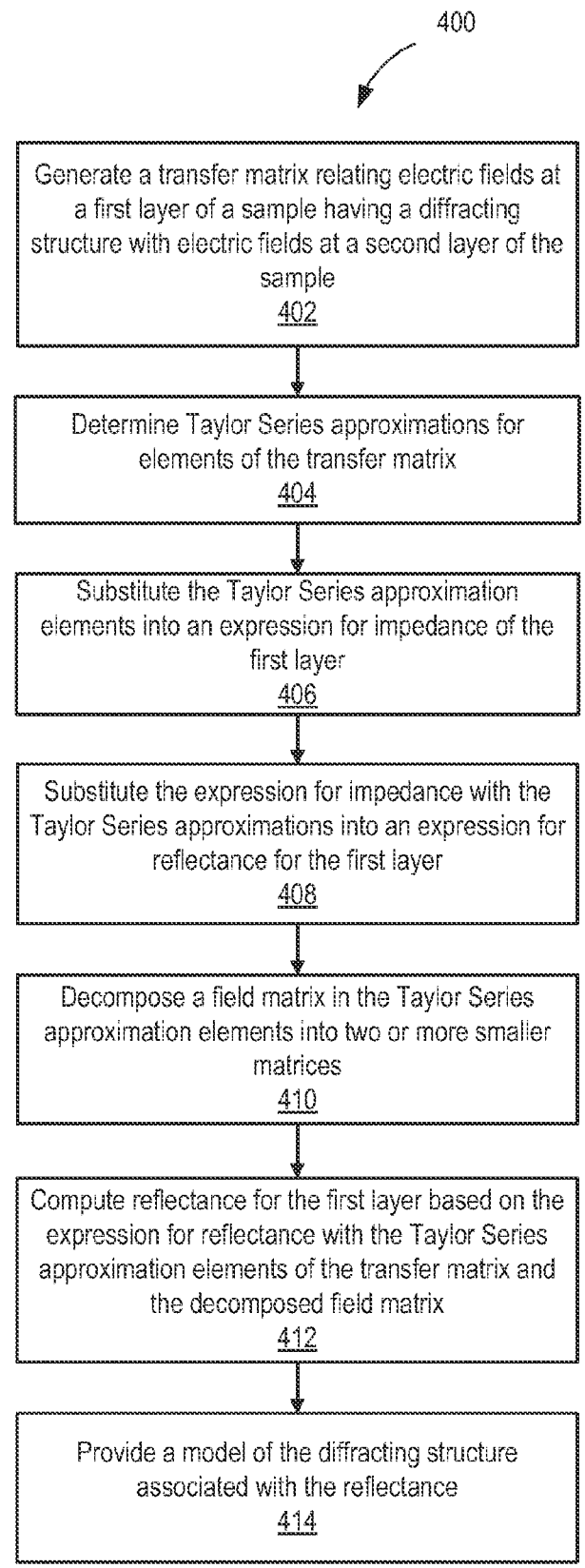
FIG. 4 is a flow diagram illustrating a method for evaluating a diffracting structure, including providing a model of the diffracting structure based on approximate and symmetry-accelerated spectral methods, in accordance with an embodiment of the invention.
Figure 5:
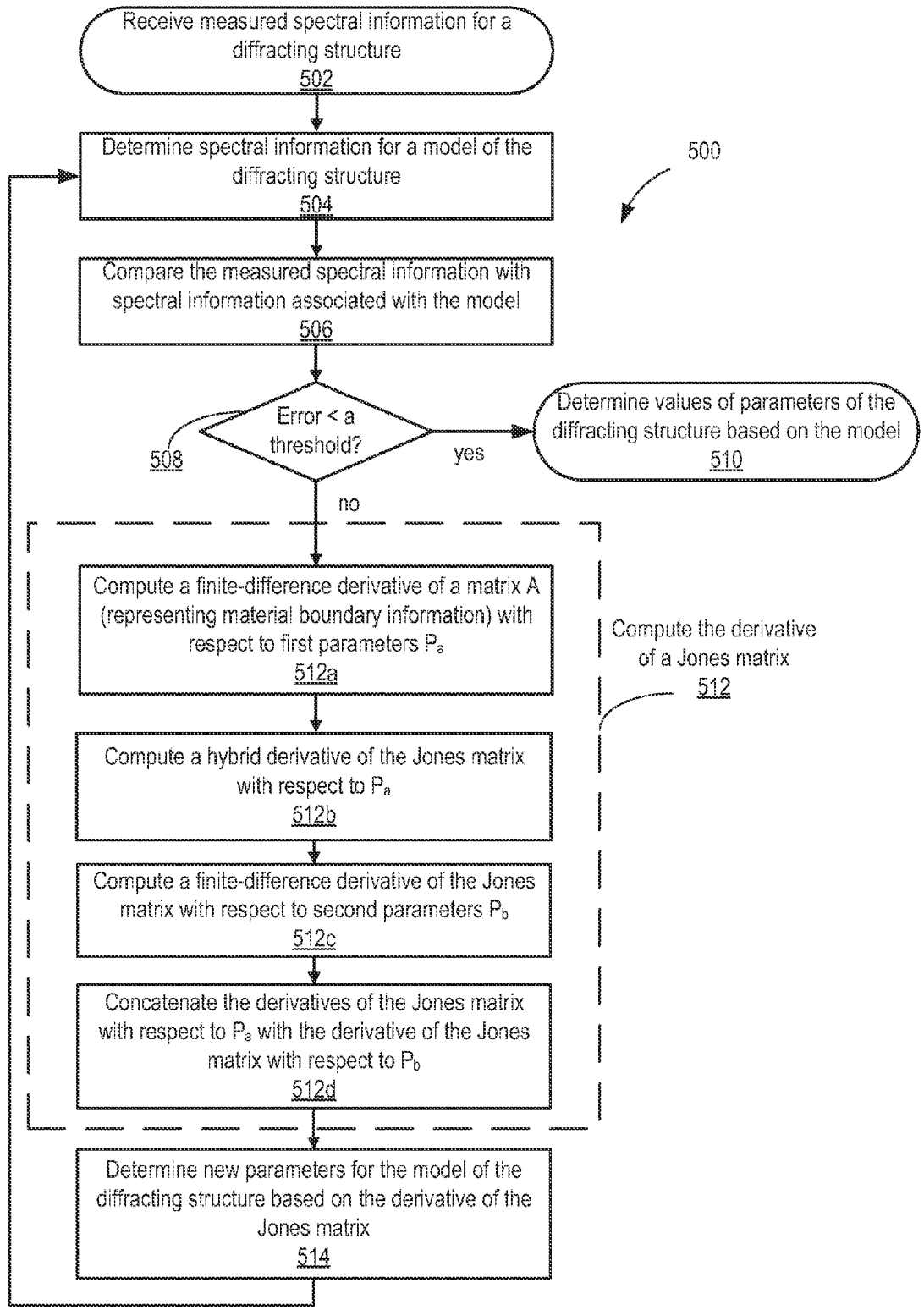
FIG. 5 is a flow diagram illustrating a method for evaluating a diffracting structure including computing a hybrid derivative of a Jones matrix, in accordance with an embodiment of the invention.

FIGS. 4 and 5 are flow diagrams illustrating exemplary methods for evaluating a diffracting structure, in accordance with embodiments of the invention.

Figure 6:
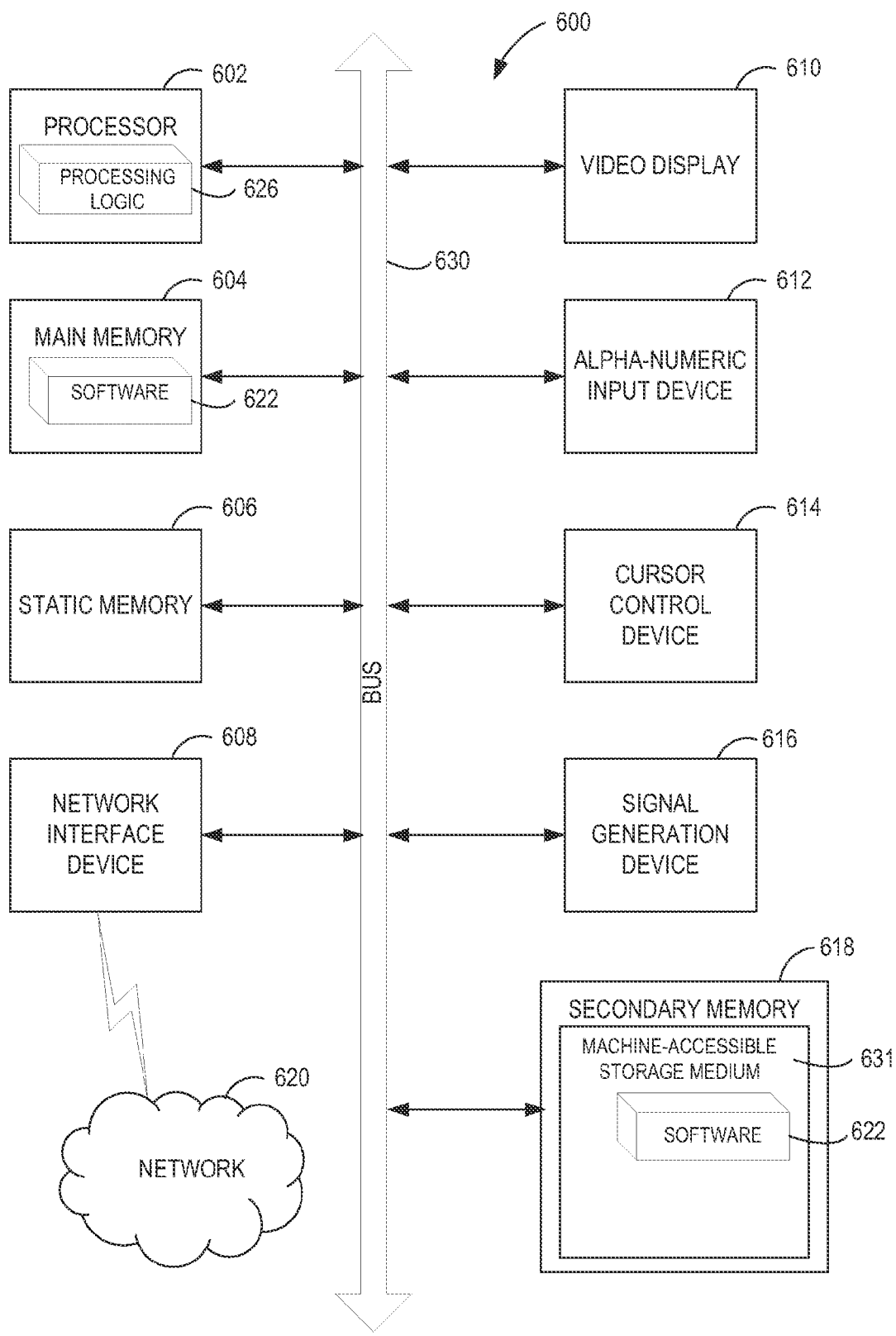
FIG. 6 illustrates a block diagram of an exemplary computing system in accordance with which embodiments may operate, be installed, integrated, or configured.

The following description refers to an optical metrology system (e.g., the optical metrology system 704 of FIG. 7) as performing methods 400 and 500, however the methods 400 and 500 can be performed in whole or part by any appropriate computing system or combination of systems (e.g., the computing system 600 of FIG. 6, or any other computing system).

Figure 2:
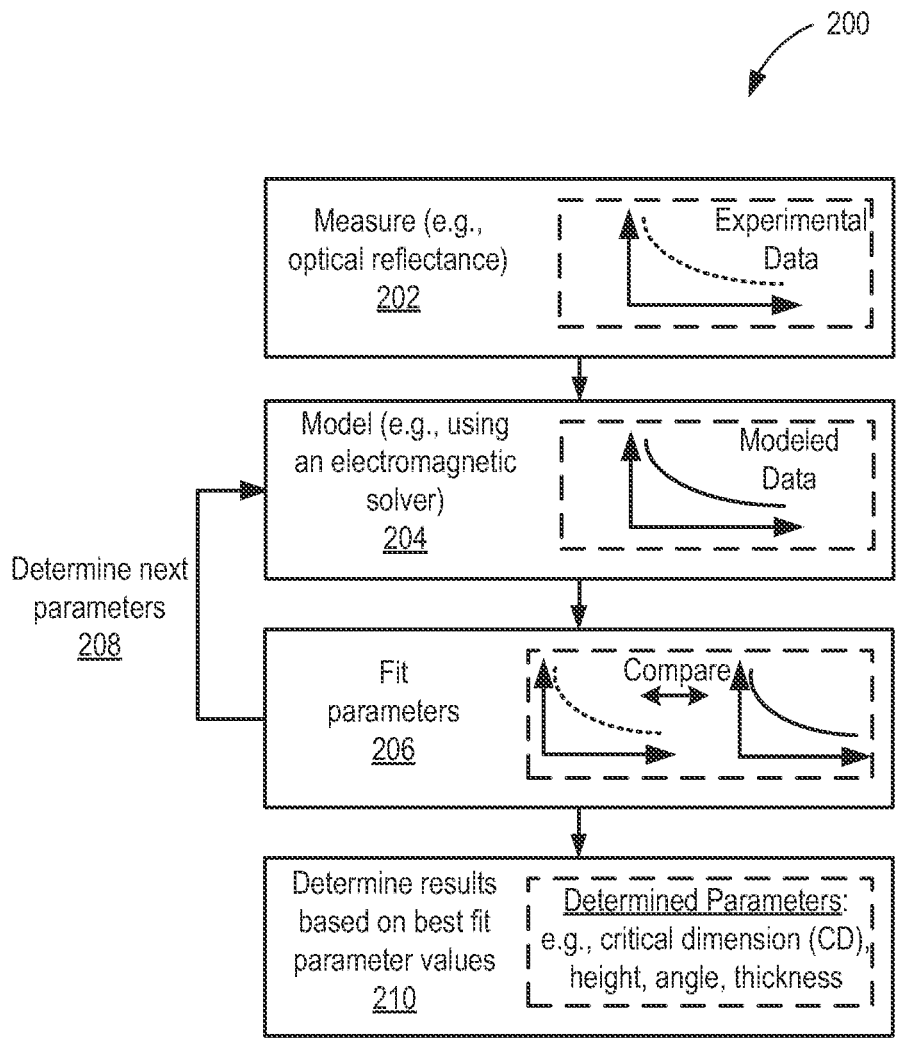
FIG. 2 illustrates a method for analyzing a diffracting structure.

Evaluating a diffracting structure on a sample via the methods 400 and/or 500 can include operations similar to those in method 200 of FIG. 2. For example, evaluating a diffracting structure can include: providing a model of the diffracting structure (e.g., block 204 of FIG. 2), performing a regression analysis including comparing modeled data to measured data (e.g., block 206 of FIG. 2), determining changes to the model parameters for subsequent iterations in the regression analysis (e.g., 208 of FIG. 2), and/or determining parameters of the diffracting structure based on the parameters of one of the models (e.g., block 210 of FIG. 2).

FIG. 4 illustrates a method 400 for evaluating a diffracting structure illuminated by incident light according to one embodiment of the invention. In the illustrated embodiment, method 400 can be used to provide a model of the diffracting structure. The diffracting structure can include multiple layers, including a top layer with a grating. One or more layers below the top grating layer can also include gratings. According to one embodiment, an optical metrology system generates a transfer matrix having Taylor Series approximations for elements. For example, at block 402 the optical metrology system generates a transfer matrix relating electric fields at a first layer of a sample having a diffracting structure with electric fields at a second layer of the sample, as in equation (1):

$$\begin{bmatrix} Y_n e_{t,n} \\ e_{t,n} \end{bmatrix} = \begin{bmatrix} \underbrace{F_n^{-1}(\cosh S_n z) F_n}_{A_{00,n}} & \underbrace{F_n^{-1} S_n^2 \dfrac{\sinh S_n z}{S_n}}_{A_{01,n}} \\ \underbrace{\dfrac{\sinh S_n z}{S_n} F_n}_{A_{10,n}} & \underbrace{\cosh S_n z}_{A_{11,n}} \end{bmatrix} \begin{bmatrix} Y_{n-1} e_{t,n-1} \\ e_{t,n-1} \end{bmatrix} \quad (1)$$

where $Y_n$ represents the impedance at layer n, $e_{t,n}$ represents the tangential electric field at layer n, $F_n$ and $G_n$ are field matrices representing boundary conditions at layer n, and $S_n$ is the product of $F_n$ and $G_n$. The field matrices include material boundary information at layer n, geometric shape information at layer n, and/or other boundary conditions. In one embodiment, the field matrices can represent the boundary conditions for the field solver as a Fourier spectrum (e.g., in terms of spectral harmonics). The field matrices and the tangential electric fields can be represented by equations (2)-(4):

$$e_{t,n} = \begin{bmatrix} e_{x,n} \\ e_{y,n} \end{bmatrix} \quad (2)$$

$$F = j\frac{k_o^2}{\omega \varepsilon_o} \begin{bmatrix} -K_x \varepsilon_z^{-1} K_y & (-I + K_x \varepsilon_z^{-1} K_x) \\ (I - K_y \varepsilon_z^{-1} K_y) & K_y \varepsilon_z^{-1} K_x \end{bmatrix} \quad (3)$$

$$G = j\frac{k_o^2}{\omega \mu_o} \begin{bmatrix} -K_x K_y & (-\varepsilon + K_x^2) \\ (\varepsilon - K_y^2) & K_y K_x \end{bmatrix} \quad (4)$$

where $\in$ and $\in_z$ are material matrices representing permittivity, and can be derived from the 2D Fourier series representation of the grating geometry with $\in$ representing x, y diagonal elements of the dielectric permittivity tensor and $\in_z$ representing the z diagonal element. As illustrated in equations (3) and (4), the field matrices include dielectric permittivity, according to one embodiment. In one such embodiment, the method 400 further includes computing Fourier coefficients of the distribution of the dielectric permittivity of the $n^{th}$ layer.

In existing methods, an optical metrology system solves an exact eigenvalue problem for each of the elements in the 2×2 matrix of equation (1) (e.g., using the eigensolution of $S_n^2$). In contrast to existing methods, at block 404, the optical metrology system determines a Taylor Series approximation for at least one of the elements of the transfer matrix. According to one embodiment, Taylor Series approximations for elements of the transfer matrix include second order terms for diagonal elements and first order terms for non-diagonal elements. For example, the transfer matrix can be represented by Taylor Series approximation elements as shown in equation (5):

$$\begin{bmatrix} \underbrace{F_n^{-1}(\cosh S_n z)F_n}_{A_{00,n}} & \underbrace{F_n^{-1}S_n^2 z \dfrac{\sinh S_n z}{S_n z}}_{G_n} \\ & \underbrace{\phantom{X}}_{A_{01,n}} \\ \underbrace{\dfrac{\sinh S_n z}{S_n z}F_n z}_{A_{10,n}} & \underbrace{\cosh S_n z}_{A_{11,n}} \end{bmatrix} \cong \tag{5}$$

$$\begin{bmatrix} F_n^{-1}\dfrac{1}{z}\left(1+\dfrac{1}{2}(S_n z)^2\right)F_n z & G_n z \\ F_n z & \left(1+\dfrac{1}{2}(S_n z)^2\right) \end{bmatrix}$$

Other embodiments can include Taylor series approximations having terms of a different order. According to one embodiment, at least one of the Taylor Series approximations of the transfer matrix includes a field matrix. For example, each of the elements of the transfer matrix in equation (5) includes $F_n$, $G_n$, or $S_n$ (i.e., both $F_n$ and $G_n$). In one embodiment, the optical metrology system can replace a coefficient of at least one of the Taylor series approximation elements of the transfer matrix with a variable to be determined empirically. For example, the coefficient of ½ for $(S_n z)^2$ can be replaced with a coefficient $c_1$ which is left open and determined empirically, as in matrix (6):

$$\begin{bmatrix} F_n^{-1}\dfrac{1}{z}(1+c_1(S_n z)^2)F_n z & G_n z \\ F_n z & (1+c_1(S_n z)^2) \end{bmatrix} \tag{6}$$

In one embodiment, at block 406, the optical metrology system substitutes the Taylor Series approximation elements into an expression for impedance of the $n^{th}$ layer. Impedance at a layer, n, can be represented by equation (7):

$$Y_n = (A_{01,n} + A_{00,n} Y_{n-1})(A_{11,n} + A_{10,n} Y_{n-1})^{-1} \tag{7}$$

where $A_{01,n}$, $A_{00,n}$, $A_{11,n}$, and $A_{10,n}$ are elements of the transfer matrix. Substituting the Taylor Series approximation elements of the transfer matrix of equation (5) into equation (7) results in equations (8):

$$Y_n = \left(G_n z + F_n^{-1}\dfrac{1}{z}(1+c_1(S_n z)^2)F_n z Y_{n-1}\right)((1+c_1(S_n z)^2) + F_n z Y_{n-1})^{-1} \tag{8}$$

$$Y_n = (G_n z + (1+c_1 G_n z F_n z)Y_{n-1})(1+c_1(S_n z)^2 + F_n z Y_{n-1})^{-1}$$

$$Y_n = (Y_{n-1} + G_n z(1+c_1 F_n z Y_{n-1}))(c_1(S_n z)^2 + 1 + F_n z Y_{n-1})^{-1}.$$

According to one embodiment, the optical metrology system can rearrange the inverse term of the expression for impedance (e.g., the inverse term in (8)) to eliminate an asymmetric matrix term in the inverse term. For example, the expression for impedance can be rearranged as in equation (9):

$$Y_n = (Y_{n-1} + G_n z(1+c_1 F_n z Y_{n-1}))(c_1 G_n z + Y_{n-1} + (F_n z)^{-1})^{-1} (F_n z)^{-1}. \tag{9}$$

In one embodiment, at block 408, the optical metrology system substitutes the expression for impedance (e.g., equations (8) or (9)) into an expression for reflectance for the $n^{th}$ layer. The reflectance of a layer n can be represented by equation (10):

$$R_n = (I + jK_{z,n}^{-1} F_n Y_n)(I - jK_{z,n}^{-1} F_n Y_n)^{-1} = 2(I - jK_{z,n}^{-1} F_n Y_n)^{-1} - I \tag{10}$$

where $K_{z,n}$ represents the wave number in the z-direction. At block 410, the optical metrology system decomposes the field matrices in the Taylor Series approximation elements into two or more smaller matrices based on symmetry between the incident light and the diffracting structure. There is symmetry between the incident light and the diffracting structure if the plane of incidence is a symmetry plane for the diffracting structure. In other words, there is symmetry between the incident light and the diffracting structure if the diffracting structure is symmetrical when reflected about the plane of incidence.

According to one embodiment, the symmetry between the incident light and the diffracting structure enable the equations (2)-(4) to be decomposed based on two independent plane waves (e.g., a p-wave and an s-wave). For example, for a symmetric grating structure about the y-axis (e.g., azimuth angle=90°), the equations (11)-(15) are decomposed according to the p-wave and the s-wave:

$$e_{t,n} \in \left\{ \begin{bmatrix} E_{x\hat{m}n} \\ E_{y\hat{m}n} \end{bmatrix}_e, \begin{bmatrix} E_{x\hat{m}n} \\ E_{y\hat{m}n} \end{bmatrix}_o \right\} \tag{11}$$

$$F \in \{F_e, F_o\} \tag{12}$$

$$G \in \{G_e, G_o\} \tag{13}$$

$$Y_n \in \{Y_{e,n}, Y_{o,n}\} \tag{14}$$

$$S_n \in \{F_e G_e, F_o G_o\} \tag{15}$$

where the subscripts e and o denote the p-wave and s-wave respectively. Exchanging x and y variables for the expressions (11)-(15) results in analogous equations for a symmetric grating structure about the x-axis (e.g., azimuth angle=0°). The uncoupling of the p-wave and the s-wave enables computation of the corresponding impedance matrices using equation (1).

Decomposing the field matrix based on the symmetry can include, for example, determining a blocked diagonal matrix of the field matrix based a grating plane of the diffracting structure being symmetric about an incident plane of the incident light. For example, field matrices that are 100×100 matrices can be decomposed into two 50×50 matrices due to symmetry in the geometry of the diffracting structure with respect to the incident light. In one such example, performing matrix operations on the two 50×50 matrices can result in significant gains in speed.

At block 412, the optical metrology system computes spectral information (e.g., reflectance) for the first layer based on the Taylor Series approximation elements of the transfer matrix with the decomposed field matrix, for example, using equation (10).

At block 414, the optical metrology system provides a model of the diffracting structure. As described above, the model includes a plurality of parameters (e.g., geometric and/or other parameters). After providing the model, in one embodiment the optical metrology system determines an error between the spectral information associated with the model and measured spectral information for the diffracting structure. For example, a derivative of the error can be based on a derivative of the Jones matrix (e.g., the derivative of the error can be expressed as a function of the derivative of the Jones matrix). Thus, computation of the derivative of the error can also include optimizations based on symmetry between the diffracting structure and the incident light. For example, starting with the expression for reflectance in equation (10), an optical metrology system can use well-known matrix differentiation rules to obtain equation (16):

$$\partial R_N = j2(I-jK_{z,N}^{-1}F_N Y_N)^{-1}(\partial K_{z,N}^{-1}F_N Y_N + K_{z,N}^{-1}\partial F_N Y_N + K_{z,N}^{-1}F_N \partial Y_N)(I-jK_{z,N}^{-1}F_N Y_N)^{-1} \quad (16)$$

The operation count associated with equation (16) can be reduced if the optical metrology system computes a few reflectance orders (e.g., (0,0) or the specular order). For example, the optical metrology system can multiply the equation (16) by a row and column vector as in equation (17):

$$l\partial R_N r = l2j(I-jK_{z,N}^{-1}F_N Y_N)^{-1}(\partial K_{z,N}^{-1}F_N Y_N + K_{z,N}^{-1}\partial F_N Y_N + K_{z,N}^{-1}F_N \partial Y_N)(I-jK_{z,N}^{-1}F_N Y_N)^{-1}r \quad (17)$$

where $l=r^T=[0 \ldots 0 1 0 \ldots 0]$. The optical metrology system can determine an expression for the derivative of the impedance based on equation (9), as in equation (18):

$$\partial Y_n = \quad (18)$$
$$\partial (Y_{n-1} + G_n z(1 + c_1 F_n z Y_{n-1}))(c_1 G_n z + Y_{n-1} + (F_n z)^{-1})^{-1}(F_n z)^{-1} +$$
$$(Y_{n-1} + G_n z(1 + c_1 F_n z Y_{n-1}))\partial (c_1 G_n z + Y_{n-1} + (F_n z)^{-1})^{-1}(F_n z)^{-1} +$$
$$(Y_{n-1} + G_n z(1 + c_1 F_n z Y_{n-1}))(c_1 G_n z + Y_{n-1} + (F_n z)^{-1})^{-1}\partial (F_n z)^{-1}$$

Equation (18) can be expanded as in equations (19) and (20):

$$\partial Y_n = \quad (19)$$
$$(\partial Y_{n-1} + \partial (G_n z)(1 + c_1 F_n z Y_{n-1}) + c_1 G_n z(\partial (F_n z)Y_{n-1} + F_n z \partial Y_{n-1}))$$
$$(c_1 G_n z + Y_{n-1} + (F_n z)^{-1})^{-1}(F_n z)^{-1} -$$
$$(Y_{n-1} + G_n z(1 + c_1 F_n z Y_{n-1}))(c_1 G_n z + Y_{n-1} + (F_n z)^{-1})^{-1}$$
$$(c_1 \partial (G_n z) + \partial Y_{n-1} - (F_n z)^{-1}\partial (F_n z)(F_n z)^{-1})$$
$$(c_1 G_n z + Y_{n-1} + (F_n z)^{-1})^{-1}(F_n z)^{-1} -$$
$$(Y_{n-1} + G_n z(1 + c_1 F_n z Y_{n-1}))(c_1 G_n z + Y_{n-1} + (F_n z)^{-1})^{-1}$$
$$(F_n z)^{-1}\partial (F_n z)(F_n z)^{-1}$$

$$\partial Y_n = (\partial (G_n z) + (c_1 \partial (G_n z)F_n z + c_1 G_n z \partial (F_n z))Y_{n-1}) \quad (20)$$
$$(c_1 G_n z + Y_{n-1} + (F_n z)^{-1})^{-1}(F_n z)^{-1} -$$
$$Y_n(c_1(F_n z)\partial (G_n z) - \partial (F_n z)(F_n z)^{-1})(c_1 G_n z + Y_{n-1} + (F_n z)^{-1})^{-1}$$
$$(F_n z)^{-1} - Y_n \partial (F_n z)(F_n z)^{-1} + [(1 + c_1 G_n z F_n z) - Y_n(F_n z)]$$
$$(\partial Y_{n-1})(c_1 G_n z + Y_{n-1} + (F_n z)^{-1})^{-1}(F_n z)^{-1}.$$

From the error (e.g., based on the derivative of the error which, in turn, is based on equations (16)-(20)), the optical metrology system can determine parameters of a second model of the diffracting structure. If a condition such as convergence is reached, the optical metrology system can determine values of parameters of the diffracting structure based on the second model. The optical metrology system can further compute additional model iterations until a condition for terminating the regression is reached.

Although the method 400 includes substitutions in blocks 406 and 408, the substitutions can be implicit depending on the equations used. In other words, some embodiments do not include overt substitutions. In one embodiment, the optical metrology system computes the Taylor Series approximation elements prior to computing impedance and/or reflectance. In another embodiment, the optical metrology system substitutes the Taylor Series approximation elements into the expression for impedance and/or the expression for reflectance prior to computation. Substituting the Taylor Series approximations prior to computation can enable simplifications which can reduce matrix multiplications (e.g., due to canceled terms). However, computing the Taylor Series approximations prior to substitution can enable parallel computations, which can decrease the time to complete the method 400.

FIG. 5 is a flow diagram illustrating a method 500 for evaluating a diffracting structure including computing a hybrid derivative of a Jones matrix, in accordance with an embodiment of the invention.

As explained above with respect to FIG. 4, the following description refers to an optical metrology system (e.g., the optical metrology system 704 of FIG. 7) as performing the method 500; however the method 500 can be performed in whole or part by any computing system or combination of systems. Evaluating a diffracting structure can involve the computation of derivatives. For example, constructing a reduced-order model of the diffracting structure can require computation of Jones matrix derivatives (see, e.g., pending U.S. patent application Ser. No. 13/610,613 titled "Library Generation with derivatives in optical metrology"). In another example, determining next model parameters in a regression analysis can involve the computation of the derivative of an error, which is based on the derivative of a Jones matrix.

The embodiment illustrated by the method 500 includes computing the derivative of a Jones matrix, and using the derivative of the Jones matrix to determine next parameters for the model of the diffracting structure. As will be described in greater detail below, the embodiment illustrated in FIG. 5 includes a hybrid derivative, which includes computing an analytic derivative of a Jones matrix using derivatives computed by a finite-difference scheme as input. This is in contrast to computing purely finite-difference derivatives or purely analytic derivatives. Generally, computing the finite-difference derivative includes evaluating a function at one value, and at another value (e.g., the two-point forward difference). For example, one method includes computing a derivative as in equation (21):

$$\frac{\partial r}{\partial p} \approx \frac{\Delta r}{\Delta p} = \frac{r_{p+\Delta p} - r_p}{\Delta p} \quad (21)$$

where r is the Jones matrix, p is a parameter vector, and $\Delta p$ is a perturbation vector (e.g., a vector representing the changes in the parameter vector). Such methods can be slow due to, for example, requiring N+1 RCWA computations per derivative where N is the number of parameters. In one embodiment, the method 500 described below can improve speed by relying on one RCWA computation as opposed to the N+1 RCWA computations required in existing methods. In general, purely analytic derivatives are advantageous because they are faster to compute. However, they are not always feasible due to the complexity of a diffracting structure and/or the complexity of implementing analytic derivatives on a computer (due to numerical issues). In such cases, method 500 can be used to compute derivatives that are almost as easy to implement as purely finite-difference derivatives while being almost as fast as purely analytic derivatives.

The method 500 begins at block 502 with the optical metrology system receiving measured spectral information for a diffracting structure. Receiving measured spectral information can include, for example, receiving spectral information from a light detector such as the detector 112 of FIG. 1.

At block 504, the optical metrology system determines spectral information for a model of the diffracting structure. For example, the optical metrology system computes reflectance for the model based on the model parameters. In one embodiment, initial model generation can include computing the hybrid derivative of a Jones matrix as described below. For example, model construction can use hybrid derivatives to determine optimal parameterization (e.g., lowest correlation, highest sensitivity, etc.).

At blocks 506 and 508, the optical metrology system compares the measured spectral information with the modeled spectral information, and determines whether the error is less than a threshold value. If the error is less than a threshold value, the optical metrology system determines values of parameters of the diffracting structure based on the model at block 510.

If the error is greater than or equal to the threshold value, the optical metrology system computes the derivative of a Jones matrix including spectral information for the diffracting structure at block 512. In one embodiment, the optical metrology system computes the derivative of the Jones matrix according to equation (22):

$$\frac{\partial r}{\partial p} = f\left(\frac{\partial A}{\partial p}\right) \approx f\left(\frac{A_{p+\Delta p} - A_p}{\Delta p}\right) \quad (22)$$

where r is the Jones matrix, p is the parameter vector, $f$ is an analytic function, and A is a field matrix including material boundary information. In one embodiment, $f$ is an analytic function as in equation (23):

$$f = -A^{-1}\left(\frac{\partial A}{\partial p}\right)r \quad (23)$$

According to one embodiment, computing the derivative of the Jones matrix involves computing a finite-difference derivative of the field matrix with respect to first parameters at block 512*a*. For example, the optical metrology system computes the derivative of the Jones matrix according to equation (24):

$$\frac{A_{p_a+\Delta p_a} - A_{p_a}}{\Delta p_a} \quad (24)$$

where $p_a$ represents the first parameters. The first parameters include a parameter describing the material boundaries of the diffracting structure. For example, the first parameters can include geometric parameters such as a critical dimension of the diffracting structure, and/or material parameters such as dielectric constants of the materials in the diffracting structure.

At block 512*b*, the optical metrology system computes a hybrid derivative of the Jones matrix with respect to the first parameters using the finite-difference derivative of the field matrix with respect to the first parameters (e.g., equation (22)).

At block 512*c*, the optical metrology system computes a finite-difference derivative of the Jones matrix with respect to second parameters. For example, the optical metrology system computes the derivative of the Jones matrix according to equation (25):

$$\frac{r_{p_b+\Delta p_b} - r_{p_b}}{\Delta p_b} \quad (25)$$

where $p_b$ represents the second parameters. In one embodiment, the second parameters include a non-geometric parameter. In one embodiment the second parameters include parameters to be computed with a finite-difference analysis. For example, the second parameters can be discrete-valued parameters. According to one embodiment, the second parameters include the order of the Fourier transform used in the electromagnetic solver (e.g., block 204 of FIG. 2).

In one embodiment, at block 512*d*, the optical metrology system concatenates the derivative of the Jones matrix with respect to the first parameters with the derivative of the Jones matrix with respect to the second parameters prior to determining the values of the parameters. For example, the optical metrology system generates the matrix in equation (26):

$$\frac{\partial r}{\partial p} = \begin{matrix} \frac{\partial r_1}{\partial p_{a1}} & \cdots & \frac{\partial r_1}{\partial p_{aN}} & \frac{\partial r_1}{\partial p_{b1}} & \cdots & \frac{\partial r_1}{\partial p_{bM}} \\ \frac{\partial r_2}{\partial p_{a1}} & \cdots & \frac{\partial r_2}{\partial p_{aN}} & \frac{\partial r_2}{\partial p_{b1}} & \cdots & \frac{\partial r_2}{\partial p_{bM}} \\ \frac{\partial r_3}{\partial p_{a1}} & \cdots & \frac{\partial r_3}{\partial p_{aN}} & \frac{\partial r_3}{\partial p_{b1}} & \cdots & \frac{\partial r_3}{\partial p_{bM}} \\ \frac{\partial r_4}{\partial p_{a1}} & \cdots & \frac{\partial r_4}{\partial p_{aN}} & \frac{\partial r_4}{\partial p_{b1}} & \cdots & \frac{\partial r_4}{\partial p_{bM}} \end{matrix} \quad (26)$$

where there are N first parameters, and M second parameters. Thus, in one embodiment both hybrid and non-hybrid derivatives are concatenated into a single Jacobian matrix. Generating a single Jacobian matrix including both hybrid and non-hybrid derivatives can enable faster evaluation of a diffracting structure if, for example, there is correlation between parameters.

At block 514, the optical metrology system determines new parameters of the model of the diffracting structure based on the derivative of the Jones matrix computed at block 512. For example, the optical metrology system determines parameters of a second model of the diffracting structure based on the derivative of an error between modeled spectral information and measured spectral information for the diffracting structure. In one embodiment, the derivative of the error is based on the derivative of the Jones matrix.

The optical metrology system then determines spectral information for a model with the new parameters at block 504. According to one embodiment, the optical metrology system continues the method at blocks 504-514 until a condition is reached indicating the regression should be terminated, such as the detecting that the error between the modeled and measured data is less than a threshold value. When such a condition is satisfied, the optical metrology system determines values of parameters of the diffracting structure based on the values of parameters of the model.

According to one embodiment, the optical metrology system further computes an analytic derivative of the Jones matrix with respect to third parameters. For example, the optical metrology system computes the derivative of the Jones matrix as in equation (27):

$$\frac{\partial r}{\partial p_c} \quad (27)$$

where $p_c$ represents the third parameters. The third parameters include analytically calculable parameters, according to one embodiment. For example, the third parameters include a thickness parameter of the diffracting structure. The optical metrology system can then concatenate the derivatives of the Jones matrix with respect to the first, second, and third parameters prior to determining the values of the parameters. For example, the optical metrology system generates the matrix in equation (28):

$$\frac{\partial r}{\partial p} = \begin{bmatrix} \frac{\partial r_1}{\partial p_{a1}} & \cdots & \frac{\partial r_1}{\partial p_{aN}} & \frac{\partial r_1}{\partial p_{b1}} & \cdots & \frac{\partial r_1}{\partial p_{bM}} & \frac{\partial r_1}{\partial p_{c1}} & \cdots & \frac{\partial r_1}{\partial p_{cQ}} \\ \frac{\partial r_2}{\partial p_{a1}} & \cdots & \frac{\partial r_2}{\partial p_{aN}} & \frac{\partial r_2}{\partial p_{b1}} & \cdots & \frac{\partial r_2}{\partial p_{bM}} & \frac{\partial r_2}{\partial p_{c1}} & \cdots & \frac{\partial r_2}{\partial p_{cQ}} \\ \frac{\partial r_3}{\partial p_{a1}} & \cdots & \frac{\partial r_3}{\partial p_{aN}} & \frac{\partial r_3}{\partial p_{b1}} & \cdots & \frac{\partial r_3}{\partial p_{bM}} & \frac{\partial r_3}{\partial p_{c1}} & \cdots & \frac{\partial r_3}{\partial p_{cQ}} \\ \frac{\partial r_4}{\partial p_{a1}} & \cdots & \frac{\partial r_4}{\partial p_{aN}} & \frac{\partial r_4}{\partial p_{b1}} & \cdots & \frac{\partial r_4}{\partial p_{bM}} & \frac{\partial r_4}{\partial p_{c1}} & \cdots & \frac{\partial r_4}{\partial p_{cQ}} \end{bmatrix} \quad (28)$$

where there are Q third parameters. As with concatenating the finite-difference derivatives with respect to $p_b$ in matrix (26), concatenating the analytic derivatives with respect to $p_c$ can enable faster evaluation of a diffracting structure if there is correlation amongst parameters. Additionally, because computation of analytic derivatives is generally faster than finite-difference derivatives, using analytic derivatives can make the structure evaluation faster.

Thus, embodiments using hybrid derivatives as described above can improve the speed of diffracting structure evaluation and analysis.

FIG. 6 illustrates a block diagram of an exemplary computing system in accordance with which embodiments may operate, be installed, integrated, or configured. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a server, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computing system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations and steps discussed herein.

The computing system 600 may further include a network interface device 608. The computing system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 631 on which is stored one or more sets of instructions (e.g., software 622) embodying any one or more of the methodologies or functions described herein. The software 622 may also reside, completely or at least partially, within the main memory 604 and/or within the processor 602 during execution thereof by the computing system 600, the main memory 604 and the processor 602 also constituting machine-readable storage media. The software 622 may further be transmitted or received over a network 620 via the network interface device 608.

While the machine-accessible storage medium 631 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media, as well as other similarly non-transitory media.

Figure 7:
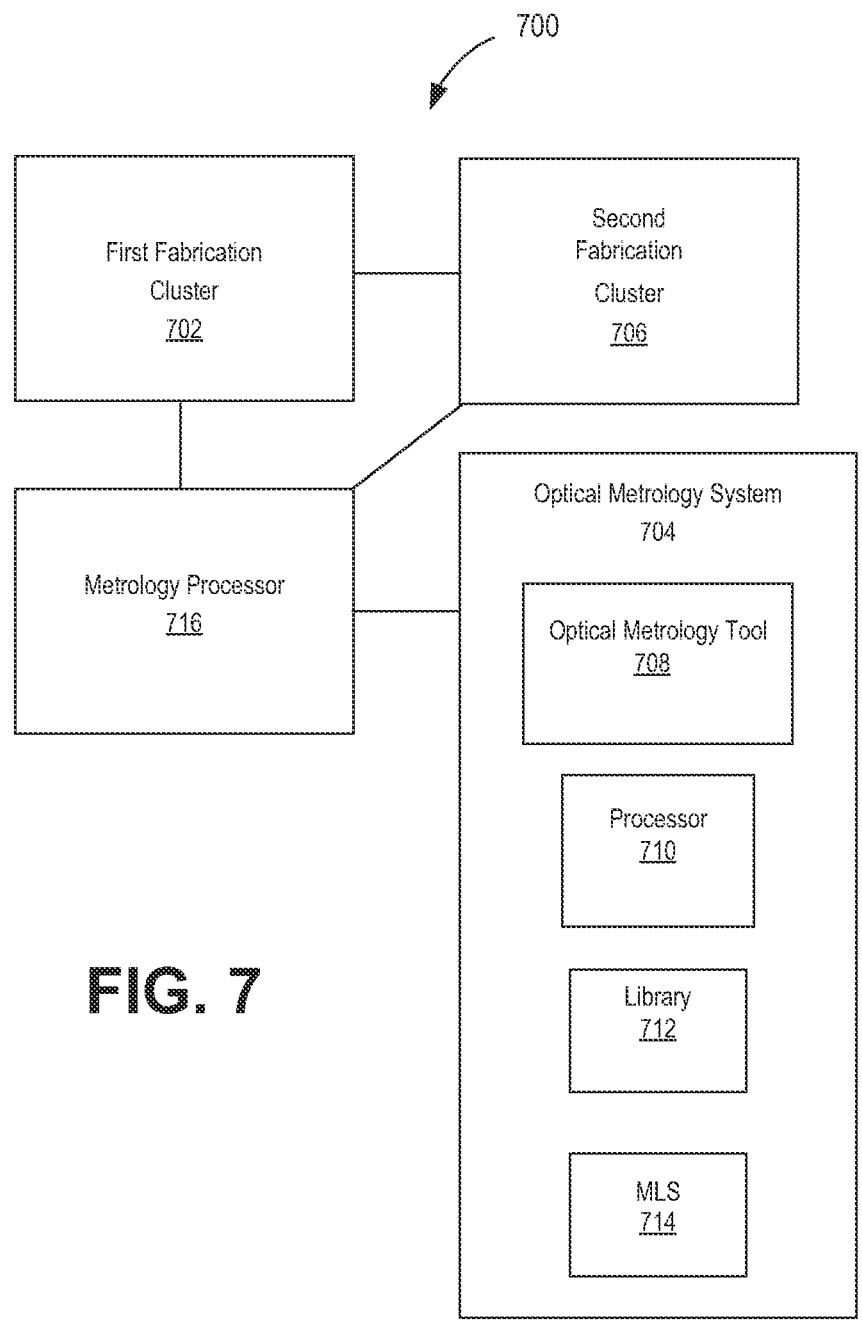
FIG. 7 is a block diagram illustrating select elements of a system according to an embodiment for determining and utilizing profile parameters for automated process and equipment control.

FIG. 7 is an exemplary block diagram of a system for determining and utilizing profile parameters for automated process and equipment control.

System 700 includes a first fabrication cluster 702 and an optical metrology system 704 (e.g., an optical measurement system). The optical metrology system 704 can include, for example, a spectroscopic ellipsometer (SE), a dual-beam spectrophotometer (DBS), a polarized DBS, a beam reflectometer, or any other optical measurement system. System 700 also includes a second fabrication cluster 706. Although the second fabrication cluster 706 is depicted in FIG. 7 as being subsequent to the first fabrication cluster 702, it should be recognized that the second fabrication cluster 706 can be located prior to the first fabrication cluster 702 in the system 700 (e.g. and in the manufacturing process flow).

A photolithographic process, such as exposing and/or developing a photoresist layer applied to a wafer, can be performed using the first fabrication cluster 702. In one exemplary embodiment, the optical metrology system 704 includes an optical metrology tool 708 and a processor 710. The optical metrology tool 708 is configured to measure a diffraction signal off of the structure. If the measured diffraction signal and the simulated diffraction signal match, one or more values of the profile parameters are presumed equal to the one or more values of the profile parameters associated with the simulated diffraction signal.

In one exemplary embodiment, the optical metrology system 704 can also include a library 712 with a plurality of simulated (e.g., computed) diffraction signals and a plurality of values of one or more profile parameters associated with the plurality of simulated diffraction signals. The library can be generated in advance. The processor 710 can compare a measured diffraction signal of a structure to the plurality of simulated diffraction signals in the library. When a matching simulated diffraction signal is found, the one or more values of the profile parameters associated with the matching simulated diffraction signal in the library is assumed to be the one or more values of the profile parameters used in the wafer application to fabricate the structure.

The system 700 also includes a metrology processor 716. In one exemplary embodiment, the processor 710 can transmit the one or more values of the one or more profile parameters to the metrology processor 716. The metrology processor 716 can then adjust one or more process parameters or equipment settings of the first fabrication cluster 702 based on the one or more values of the one or more profile parameters determined using the optical metrology system 704. The metrology processor 716 can also adjust one or more process parameters or equipment settings of the second fabrication cluster 706 based on the one or more values of the one or more profile parameters determined using the optical metrology system 704. As noted above, the second fabrication cluster 706 can process the wafer before or after the first fabrication cluster 702. In another exemplary embodiment, the processor 710 is configured to train a machine learning system 714 using the set of measured diffraction signals as inputs to the machine learning system 714 and profile parameters as the expected outputs of the machine learning system 714.

One or more components of the system 700 can include or implement embodiments of the invention as described herein. For example, in one embodiment the optical metrology system 704 includes logic for receiving optical reflectance measurements for the diffracting structure. Logic for receiving measurements can be included in, for example, the optical metrology tool 708. A processor (e.g., the processor 710) can be configured to evaluate the diffracting structure according to a method including: generating a transfer matrix having Taylor Series approximations for elements, the transfer matrix relating electric fields at a first layer of the sample with electric fields at a second layer of the sample, at least one of the Taylor Series approximations including a field matrix representing boundary conditions; decomposing the field matrix into two or more smaller matrices based on a symmetry between the incident light and the diffracting structure; computing spectral information for the first layer based on the Taylor Series approximation elements of the transfer matrix with the decomposed field matrix; and providing a model of the diffracting structure, the model associated with the spectral information.

According to one embodiment, a processor (e.g., the processor 710) is configured to evaluate the diffracting structure according to a method including: computing a finite-difference derivative of a field matrix with respect to first parameters, the field matrix including material boundary information and the first parameters including a parameter describing the material boundaries of the diffracting structure; computing an analytic derivative of a Jones matrix with respect to the first parameters using the finite-difference derivative of the field matrix as input, the Jones matrix including spectral information for the diffracting structure; computing a finite-difference derivative of the Jones matrix with respect to second parameters including a non-material boundary parameter; and determining values of parameters of the diffracting structure based on the derivative of the Jones matrix with respect to the first parameters and the finite-difference derivative of the Jones matrix with respect to the second parameters.

It is to be understood that the above description is intended to be illustrative, and not restrictive. Many other embodiments will be apparent to those of skill in the art upon reading and understanding the above description. Although the present invention has been described with reference to particular embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense. The scope of the invention should, therefore, be determined with reference to the appended claims, along with the full scope of equivalents to which such claims are entitled.

What is claimed is:

1. A method of evaluating a diffracting structure using an optical metrology system, the method comprising:
    measuring spectral information for a diffracting structure using an optical metrology tool of the optical metrology system;
    computing, with a processor of the optical metrology system, the following:
        a finite-difference derivative of a field matrix with respect to first parameters of a model of the diffracting structure, the field matrix comprising material boundary information and the first parameters comprising a parameter describing the material boundaries of the diffracting structure,
        an analytic derivative of a Jones matrix with respect to the first parameters using the finite-difference derivative of the field matrix with respect to the first parameters, and
        a finite-difference derivative of the Jones matrix with respect to second parameters of the model comprising a non-material boundary parameter; and
    determining values of parameters of the diffracting structure based on the measured spectral information for the diffracting structure and on the analytic derivative of the Jones matrix with respect to the first parameters and the finite-difference derivative of the Jones matrix with respect to the second parameters.

2. The method of claim 1, further comprising:
    concatenating the derivative of the Jones matrix with respect to the first parameters with the derivative of the Jones matrix with respect to the second parameters prior to determining the values of the parameters of the diffracting structure.

3. The method of claim 1, wherein determining values of parameters of the diffracting structure further includes:
    generating the model of the diffracting structure based on the derivative of the Jones matrix with respect to the first parameters and the finite-difference derivative of the Jones matrix with respect to the second parameters, wherein the Jones matrix represents reflectance for the model of the diffracting structure.

4. The method of claim 1, further comprising:
    determining parameters of a second model of the diffracting structure based on the derivative of an error between modeled spectral information and measured spectral information for the diffracting structure, wherein the derivative of the error is based on the derivative of the Jones matrix with respect to the first parameters and the finite-difference derivative of the Jones matrix with respect to the second parameters; and wherein determining the values of the parameters of the diffracting structure is based on the second model if a convergence condition is reached.

5. The method of claim 1, wherein the first parameters are geometric parameters.

6. The method of claim 1, wherein the second parameters comprise parameters to be computed with a finite-difference analysis.

7. The method of claim 1, wherein the first parameters comprise one or more of:
a critical dimension of the diffracting structure and dielectric constants of the materials in the diffracting structure.

8. The method of claim 1, wherein the second parameters comprise the order of Fourier transform used in an electromagnetic solver.

9. The method of claim 1, further comprising computing with the processor:
an analytic derivative of the Jones matrix with respect to third parameters of the model, the third parameters comprising a thickness parameter of the diffracting structure.

10. The method of claim 9, further comprising:
concatenating the derivative of the Jones matrix with respect to the first parameters with the derivative of the Jones matrix with respect to the second parameters and derivative of the Jones matrix with respect to third parameters prior to determining the values of the parameters.

11. A non-transitory machine-readable storage medium having instructions stored thereon that, when executed by a processor, cause a data processing system to perform a method of computation in an optical measurement system to evaluate a diffracting structure, the method comprising:
measuring spectral information for the diffracting structure using an optical metrology tool of the optical measurement system;
computing, with a processor of the optical measurement system, the following:
a finite-difference derivative of a field matrix with respect to first parameters of a model of the diffracting structure, the field matrix comprising material boundary information and the first parameters comprising a parameter describing the material boundaries of the diffracting structure,
an analytic derivative of a Jones matrix with respect to the first parameters using the finite-difference derivative of the field matrix with respect to the first parameters and
a finite-difference derivative of the Jones matrix with respect to second parameters of the model comprising a non-material boundary parameter; and
determining values of parameters of the diffracting structure based on the measured spectral information for the diffracting structure and on the analytic derivative of the Jones matrix with respect to the first parameters and the finite-difference derivative of the Jones matrix with respect to the second parameters.

12. The machine-readable storage medium of claim 11, the method further comprising:
concatenating the derivative of the Jones matrix with respect to the first parameters with the derivative of the Jones matrix with respect to the second parameters prior to determining the values of the parameters of the diffracting structure.

13. The machine-readable storage medium of claim 11, wherein the first parameters are geometric parameters.

14. The machine-readable storage medium of claim 11, wherein the second parameters comprise parameters to be computed with a finite-difference analysis.

15. The machine-readable storage medium of claim 11, wherein the first parameters comprise one or more of: a critical dimension of the diffracting structure and dielectric constants of the materials in the diffracting structure.

16. The machine-readable storage medium of claim 11, wherein the second parameters comprise an order of formulation of a Fourier transform.

17. The machine-readable storage medium of claim 11, the method further comprising:
computing an analytic derivative of the Jones matrix with respect to third parameters of the model, the third parameters comprising a thickness parameter of the diffracting structure.

18. The machine-readable storage medium of claim 17, the method further comprising:
concatenating the derivative of the Jones matrix with respect to the first parameters with the derivative of the Jones matrix with respect to the second parameters and derivative of the Jones matrix with respect to third parameters prior to determining the values of the parameters of the diffracting structure.

19. An optical measurement system comprising:
an optical metrology tool for receiving optical reflectance measurements for a diffracting structure; and
a processor configured to evaluate the diffracting structure according to a method comprising:
computing a finite-difference derivative of a field matrix with respect to first parameters of a model of the diffracting structure, the field matrix comprising material boundary information and the first parameters comprising a parameter describing the material boundaries of the diffracting structure;
computing an analytic derivative of the Jones matrix with respect to the first parameters using the finite-difference derivative of the field matrix with respect to the first parameters;
computing a finite-difference derivative of the Jones matrix with respect to second parameters of the model comprising a non-material boundary parameter; and
determining values of parameters of the diffracting structure based on the optical reflectance measurements for the diffracting structure and on the analytic derivative of the Jones matrix with respect to the first parameters and the finite-difference derivative of the Jones matrix with respect to the second parameters.

20. The optical measurement system of claim 19, wherein the processor is configured to evaluate the structure according to the method further comprising:
computing an analytic derivative of the Jones matrix with respect to third parameters of the model, the third parameters comprising a thickness parameter of the diffracting structure.

21. A method of evaluating a diffracting structure associated with a sample illuminated by incident light using an optical metrology system, the method comprising:
measuring spectral information for the diffracting structure using an optical metrology tool of the optical metrology system;
processing the following using a processor of the optical metrology system:
generating a transfer matrix having Taylor Series approximations for elements, the transfer matrix relating electric fields at a first layer of the sample with electric fields at a second layer of the sample, at least one of the Taylor Series approximations comprising a field matrix representing boundary conditions;

decomposing the field matrix into two or more smaller matrices based on a symmetry between the incident light and the diffracting structure;

computing spectral information for the first layer based on the Taylor Series approximation elements of the transfer matrix with the decomposed field matrix;

generating a model of the diffracting structure, the model being associated with the calculated spectral information; and determining values of parameters of the diffracting structure based on the measured spectral information for the diffracting structure and on the model.

22. The method of claim 21, wherein the Taylor Series approximations for elements of the transfer matrix comprise second order terms for diagonal elements and first order terms for non-diagonal elements.

23. The method of claim 21, wherein the diffracting structure comprises a grating with symmetry in one dimension.

24. The method of claim 21, wherein the diffracting structure comprises a grating with symmetry in two dimensions.

25. The method of claim 21, wherein decomposing the field matrix based on the symmetry comprises:

determining a blocked diagonal matrix of the field matrix based a grating plane of the diffracting structure being symmetric about an incident plane of the incident light.

26. The method of claim 21, wherein:

the field matrix comprises dielectric permittivity, the method further comprising computing Fourier coefficients of distribution of the dielectric permittivity of the first layer.

27. The method of claim 21, further comprising:

replacing a coefficient of at least one of the Taylor series approximation elements of the transfer matrix with a variable to be determined empirically.

28. The method of claim 21, further comprising:

determining an error between the spectral information associated with the model and measured spectral information for the diffracting structure; and determining parameters of a second model of the diffracting structure based on the error;

wherein determining values of parameters of the diffracting structure includes determining values of parameters of the diffracting structure based on the second model if a second error between second spectral information associated with the second model and the measured spectral information is less than a threshold value.

29. The method of claim 21, wherein computing the spectral information for the first layer comprises:

substituting the Taylor Series approximation elements of the transfer matrix into an expression for impedance at the first layer; and substituting the expression for impedance into an expression for reflectance at the first layer.

30. The method of claim 29, further comprising:

rearranging an inverse term of the expression for impedance to eliminate an asymmetric matrix term in the inverse term.

31. The method of claim 29, further comprising computing impedance at the first layer based on the Taylor Series approximation elements of the transfer matrix with the decomposed field matrix.

32. A non-transitory machine-readable storage medium having instructions stored thereon that, when executed by a processor, cause a data processing system to perform a method of computation in an optical measurement system to evaluate a diffracting structure, the method comprising:

measuring spectral information for a diffracting structure using an optical metrology tool of the optical measurement system; and with a processor of the optical measurement system, the following:

generating a transfer matrix having Taylor Series approximations for elements, the transfer matrix relating electric fields at a first layer of the sample with electric fields at a second layer of the sample, at least one of the Taylor Series approximations comprising a field matrix representing boundary conditions;

decomposing the field matrix into two or more smaller matrices based on a symmetry between the incident light and the diffracting structure;

computing spectral information for the first layer based on the Taylor Series approximation elements of the transfer matrix with the decomposed field matrix;

generating a model of the diffracting structure, the model being associated with the calculated spectral information; and determining values of parameters of the diffracting structure based on the measured spectral information for the diffracting structure and on the model.

33. The machine-readable storage medium of claim 32, wherein the Taylor Series approximations for elements of the transfer matrix comprise second order terms for diagonal elements and first order terms for non-diagonal elements.

34. The machine-readable storage medium of claim 32, wherein decomposing the field matrix based on the symmetry comprises:

determining a blocked diagonal matrix of the field matrix based a grating plane of the diffracting structure being symmetric about an incident plane of the incident light.

35. The machine-readable storage medium of claim 32, wherein:

the field matrix comprises dielectric permittivity, the method further comprising computing Fourier coefficients of distribution of the dielectric permittivity of the first layer.

36. The machine-readable storage medium of claim 32, the method further comprising:

replacing a coefficient of at least one of the Taylor series approximation elements of the transfer matrix with a variable to be determined empirically.

37. The machine-readable storage medium of claim 32, wherein computing the spectral information for the first layer comprises:

substituting the Taylor Series approximation elements of the transfer matrix into an expression for impedance at the first layer; and substituting the expression for impedance into an expression for reflectance at the first layer.

38. The machine-readable storage medium of claim 37, the method further comprising:

rearranging an inverse term of the expression for impedance to eliminate an asymmetric matrix term in the inverse term.

39. The machine-readable storage medium of claim 37, the method further comprising computing impedance at the first layer based on the Taylor Series approximation elements of the transfer matrix with the decomposed field matrix.

40. An optical measurement system comprising:

an optical metrology tool for receiving optical reflectance measurements for the diffracting structure; and a processor configured to evaluate the diffracting structure according to a method comprising:
generating a transfer matrix having Taylor Series approximations for elements, the transfer matrix relating electric fields at a first layer of the sample with electric fields at a second layer of the sample, at least one of the Taylor Series approximations comprising a field matrix representing boundary conditions;
decomposing the field matrix into two or more smaller matrices based on a symmetry between the incident light and the diffracting structure;
computing spectral information for the first layer based on the Taylor Series approximation elements of the transfer matrix with the decomposed field matrix;
generating a model of the diffracting structure, the model being associated with the computed spectral information; and
determining values of parameters of the diffracting structure based on the optical reflectance measurements for the diffracting structure and on the model.

* * * * *